US006483100B1

(12) United States Patent
Williams et al.

(10) Patent No.: US 6,483,100 B1
(45) Date of Patent: Nov. 19, 2002

(54) PHOTONIC DEVICE

(75) Inventors: David Arfon Williams, Cambridge; Jeremy John Baumberg, Southampton, both of (GB)

(73) Assignee: Hitachi, Ltd., Tokyo (JP)

( * ) Notice: Subject to any disclaimer, the term of this patent is extended or adjusted under 35 U.S.C. 154(b) by 129 days.

(21) Appl. No.: 09/709,653

(22) Filed: Nov. 13, 2000

(30) Foreign Application Priority Data

Nov. 30, 1999 (EP) .............................. 99309573

(51) Int. Cl.$^7$ ............................... H01L 31/00
(52) U.S. Cl. ................ 250/214.1; 250/552; 257/22
(58) Field of Search .............. 250/214.1, 216, 250/552; 257/80–88, 13, 22

(56) References Cited

U.S. PATENT DOCUMENTS 4,571,727 A * 2/1986 Nishizawa et al. ............ 372/4

FOREIGN PATENT DOCUMENTS

JP          4240784       8/1992
WO          WO9625767     8/1996

OTHER PUBLICATIONS

L.A. Rivlin et al., "Photon–phonon lasing in indirect gap semiconductors," Optics Communications, Netherlands, vol. 100, p. 322–330, (Jul. 1, 1993).

K.F. Renk, *Nonequilibrium Phonons In Nonmetallic Crystals*, North–Holland Physics Publishing, "Detection of High–Frequency Phonons by Phonon–induced Fluorescence," dated Jul. 29, 1983, pp. 277–316.

M.A. Tischler et al., *Silicon–Based Optoelectronic Materials*, Materials Reserch Society, vol. 298, "The Role Of Silicon in Optoelectronics," dated Apr. 12–14, 1993, pp. 367–378.

* cited by examiner

*Primary Examiner*—Que T. Le
(74) *Attorney, Agent, or Firm*—Kenyon & Kenyon

(57) ABSTRACT

Silicon possesses an indirect band-gap, which limits its use in some photonic applications. A phonon generator is included in a silicon-based device, which promotes electron-hole recombination and so allows silicon to emit photons efficiently. Phonons may be generated by optical or electrical stimulation or as a result energy relaxation of hot-electrons.

30 Claims, 10 Drawing Sheets

PHOTONIC DEVICE

FIELD OF THE INVENTION

The present invention relates to photonic devices.

BACKGROUND OF THE INVENTION

Silicon is the material of choice for the vast majority of microelectronic applications. Silicon is inexpensive and silicon-based processing techniques are well established. However, silicon possesses an indirect band gap and so some optical processes, such as photon emission, require the assistance of a phonon of a suitable wavevector, thus severely limiting efficiency of these processes. As a result, the use of silicon in some photonic applications, such as the manufacture of light emitting diodes, semiconductor lasers and optical modulators, is severely limited.

Phonon induced luminescence in compound semiconductors is disclosed by K. F. Renk in "Non-equilibrium Phonons in Non-metallic Crystals", Eisenmenger and Kaplyanskii Eds., North-Holland, 1986). These compound semiconductors, however, exhibit lattice polarisation and strong lattice coupling and are already efficient photon generators.

Attempts to make silicon an efficient photon generator are disclosed in "Silicon Based Optoelectronic Materials", Tischler et al. Eds., Material Research Society Proc., 298 (1993). The methods disclosed make use of quantum confinement and Si:SiGe heterostructures. However, these methods have not been particularly successful and devices based on these methods certainly do not lend themselves to conventional silicon-based processing techniques.

SUMMARY OF THE INVENTION

With a view to overcoming this difficulty, the present invention provides a photon emission device comprising a region of relatively low-efficiency photon emission material and a phonon generator operable to supply phonons to said region of relatively low-efficiency photon emission material so as to make it emit photons with a relatively high efficiency.

Said phonon generator may comprise an input structure to receive electromagnetic energy so as to produce phonons. Said phonon generator may comprise a converter to convert electrical excitations into lattice excitations. Said phonon generator may comprise an electrode to apply an electric field so as to produce phonons.

Said photon generator may comprise a fabricated device arranged on a substrate.

Said region of relatively low-efficiency photon emission material may comprise indirect band gap semiconductor material, such as silicon.

Said phonon generator may comprise a local lattice polarizer, such as a doped, compensated semiconductor, or a first layer of semiconductor doped with n-type impurities and a second layer of semiconductor doped with p-type semiconductor. Said first layer and said second layer may be separated by 1–5 nm.

Said phonon generator further may include an electric field generator to stimulate phonon generation. Said electric field may be provided by an electrode disposed at an interface with said local lattice polarizer.

Said electric field generator may comprise an electrode and an insulator, wherein said insulator may be disposed between said local lattice polarizer and said electrode.

Said phonon generator may further comprise an electron-hole pair generator, for example in response to a pulse of electromagnetic radiation. Said pulse of electromagnetic radiation may be of duration less than 100 fs. Said electromagnetic radiation may have an energy above the value of band gap of said doped, compensated semiconductor material.

Said electron-hole pair generator may comprise an electric pulse and said pulse may have duration less than 50 ps and a pulse height of the order of a few volts.

Said phonon generator may comprise a hot-electron injector. Said hot-electron injector may comprise an electrode and a layer of insulator.

Said device may further comprise a hot-electron thermalizer so as to create phonons.

Said electrode may comprise a metal, which may be aluminium.

Said insulator may comprise silicon dioxide or silicon nitride and may have a thickness less than 20 nm.

An advantage of the invention is that it allows the integration of photonic technology with conventional silicon-based logic circuitry and memory. This is particularly beneficial to applications in telecommunications and computing.

According to the present invention there is also provided a method of operating a phonon emission device comprising a region of relatively low-efficiency photon emission material said method comprising supplying phonons to said region of relatively low-efficiency photon emission material so as to make it emit phonons with a relatively high-efficiency.

According to the present invention there is still further provided a modulator comprising a region of optically transparent material and a phonon generator operable to supply phonons to said region of optically transparent material so as to increase photon absorption therein.

BRIEF DESCRIPTION OF THE DRAWINGS

Embodiments of the present invention will now be described, by way of example, with reference to the accompanying drawing in which.

DESCRIPTION OF THE PREFERRED EMBODIMENTS

Figure 1:
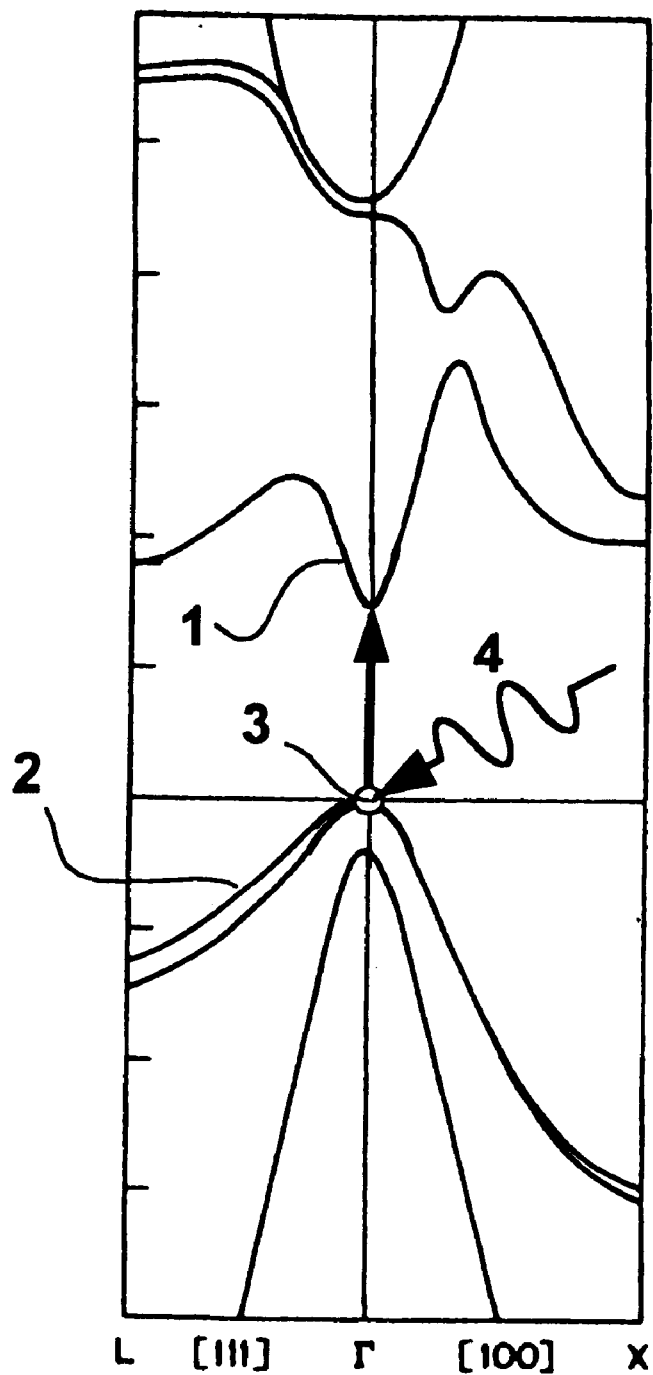
FIG. 1 is an electron dispersion relation for GaAs.

Referring to FIG. 1, gallium arsenide (GaAs) exhibits a direct band gap. This means that the lowest point of the conduction band 1 occurs at the same electron wavevector, k, as the highest point of the valence band 2. An electron-hole pair may be created by the promotion of an electron 3 from the valence band to the conduction band by the absorption of a sufficiently energetic photon 4. During this process electron momentum is conserved. For photon emission, this process is reversed and an electron-hole pair recombines.

Figure 2:
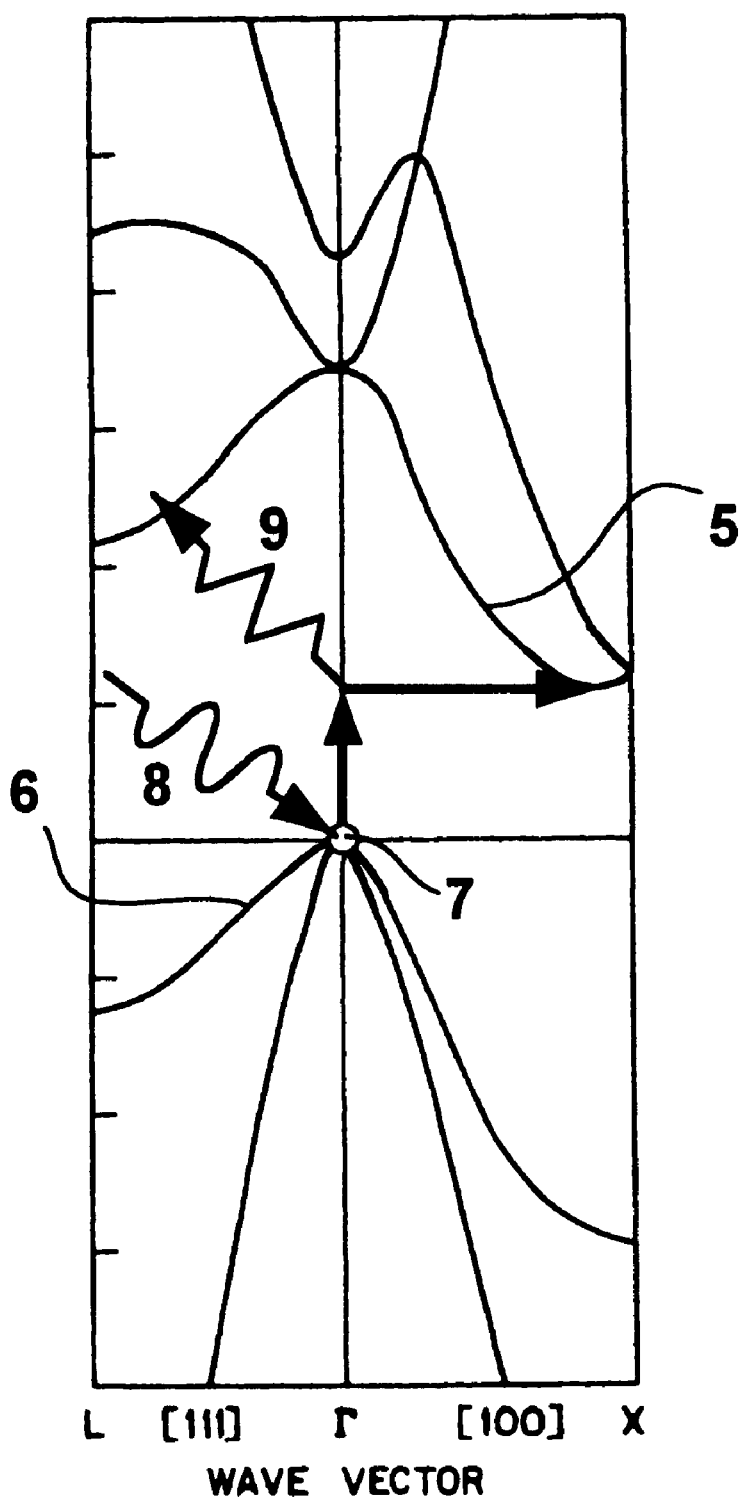
FIG. 2 is an electron dispersion relation for silicon.

Referring to FIG. 2, silicon (Si) exhibits an indirect band gap. Here, the lowest point of the conduction band 5 occurs at a different electron wavevector from the highest point of the valence band 6. An electron-hole pair is created by the promotion of an electron 7 from the valence band maximum to the conduction band minimum by the absorption of a sufficiently energetic photon 8 and the interaction of a phonon 9 having a frequency of 4.49 THz. However, for photon emission, a phonon is required to provide the missing momentum necessary for the electron-hole pair to recombine. Said change in momentum is a significant fraction of the Brillouin zone and suitable phonons of high wavevector (short wavelength and high energy) are not usually thermally activated. Therefore, silicon is not ordinarily an efficient photon emitter at room temperature, although it may be used as a good photon absorber, if photons have energies in excess of the band gap energy $E_g$, where $E_g$=1.12 eV. The invention provides a way of using an indirect band gap material such as silicon as an efficient photo-emitter.

In accordance with the invention, phonons are produced, using a phonon generator, and supplied to low efficiency materials such as Si, to cause it to emit photons with high efficiency. Some embodiments of phonon generators suitable for this purpose will now be described.

Phonon Generation by Optical Stimulation

Figure 3:
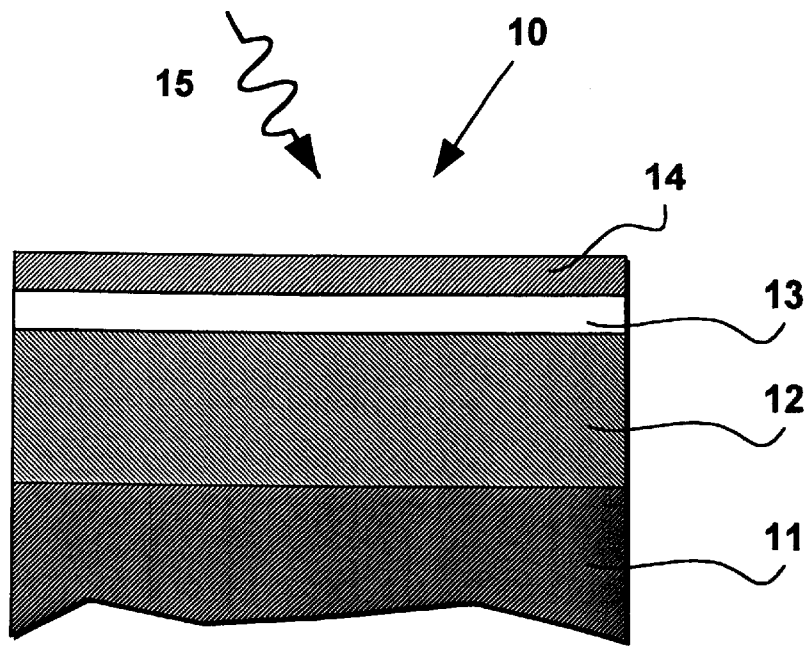
FIG. 3 is a cross-sectional view of an optically excited phonon generator.

Referring to FIG. 3, illustrates a structure which can be used as a coherent first embodiment of phonon generator based on an optically excited metal-oxide-semiconductor device 10.

Using p-type silicon as a substrate 11, a layer of compensated silicon (Si) 12 is grown by low-pressure chemical vapour deposition in a manner well known per se. The compensated Si layer 12 is 200 nm thick and is doped with boron (B) and arsenic (As) to a concentration of $N_B=N_{As}=10^{20}$ cm$^{-3}$. A silicon dioxide (SiO) tunnel barrier 13 is grown by dry oxidation at 900° C. The thickness of the SiO$_2$ barrier 13 is about 5 nm. Finally, an aluminium (Al) surface gate 14 is sputtered in a manner well known per se. The thickness of the Al layer 14 is 50 nm. It will be appreciated that the surface gate 14 may be patterned using conventional lithographic and dry etching techniques.

Operation of the coherent phonon generator 10 will now be described.

A gate voltage $V_g$=5V is applied to the surface gate 14, with the compensated Si layer 12 grounded, to create an electric field at the surface of the compensated Si layer 12. A frequency-doubled Ti-Saphire laser (not shown) is used to generate a pulse 15 having a duration of about 50 fs and a wavelength of about 400–600 nm, which is directed onto the surface of the device 10. Electron-hole pairs are generated in the silicon and are separated by the applied field, which creates an electric dipole. The dipole interacts with local lattice polarisations, created by closely spaced p- and n-type impurities, to produce optic phonons. These optic phonons decay through Klemens and Vallée channels into high energy, high wavevector phonons, for example transverse acoustic phonons.

Phonon Generation by Electrical Stimulation

Referring again to FIG. 3, the device structure 10 can also be used as a second embodiment of phonon generator based on an electrically excited metal-oxide-semiconductor device 10 and does not use optical stimulation.

The phonon generator is fabricated in the same manner as previously described.

Operation of the phonon generator 10 will now be described.

A gate voltage $V_g$=5V is applied to the surface gate 14, with the compensated Si layer 12 grounded, to create an electric field at the surface of the compensated Si layer 17. A 50 ps electric pulse of $V_g$=5V is applied to the surface gate 21. The leading edge of the pulse provides a dipole impulse to excite the lattice. The dipole interacts with local lattice polarisations to produce optic phonons. These optic phonons decay through Klemens and Vallée channels into high energy, high wavevector phonons, for example transverse acoustic phonons.

Figure 4:
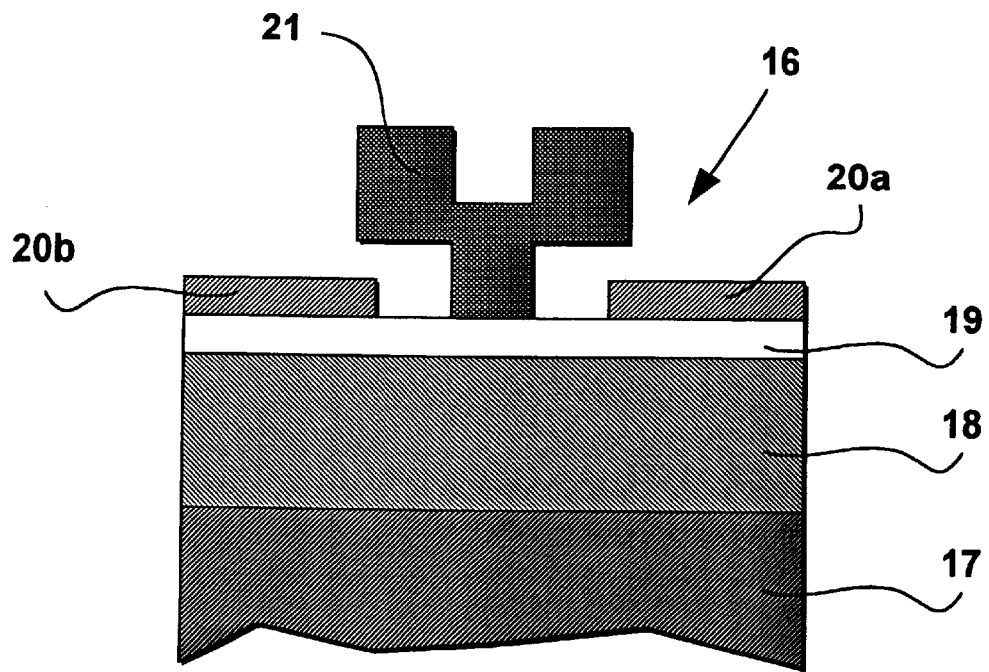
FIG. 4 is a cross-sectional view of an electrically excited phonon generator.

FIG. 4, illustrates a third embodiment of phonon generator based on an electrically excited metal-oxide-semiconductor device 16.

Using p-type Si as a substrate 17, a layer of compensated Si 18 is grown by low-pressure chemical vapour deposition in a manner well known per se. The compensated Si layer 18 is 200 nm thick and is doped with B and As to a concentration of $N_B=N_{As}=10^{20}$cm$^{-3}$. A SiO$_2$ tunnel barrier 19 is grown by dry oxidation at 900° C. The thickness of the SiO$_2$ barrier 19 is about 5 nm. Finally, an Al surface gate 20 is sputtered in a manner well known per se. The thickness of the Al layer 20 is 50 nm. The surface gate 20 is patterned using conventional lithographic and dry etching techniques to form two field gates 20a, 20b separated by 5 μm. A 'T'-shaped Al pulse gate 21, which is 2 μm wide at its base, 10 μm at its top and 200 nm tall, is fabricated in a manner well known per se.

Operation of the coherent phonon generator 16 will now be described.

A field gate voltage $V_g$=5V is applied to the field gates 20a, 20b, with the compensated Si layer 17 grounded, to create an electric field at the surface of the compensated Si layer 17. A 50 ps electric pulse of $V_g$=−5V is applied to the pulse gate 21. The leading edge of the ultrafast electric pulse provides a dipole impulse to excite the lattice. The dipole interacts with local lattice polarisations to produce optic phonons. These optic phonons decay through Klemens and Vallée channels into high energy, high wavevector phonons, for example transverse acoustic phonons.

It will be appreciated that longer electrical pulses may be used, although this will favour generation of incoherent, rather than coherent, phonons.

Semiconductor Lasers Comprising Phonon Generators

Figure 5:
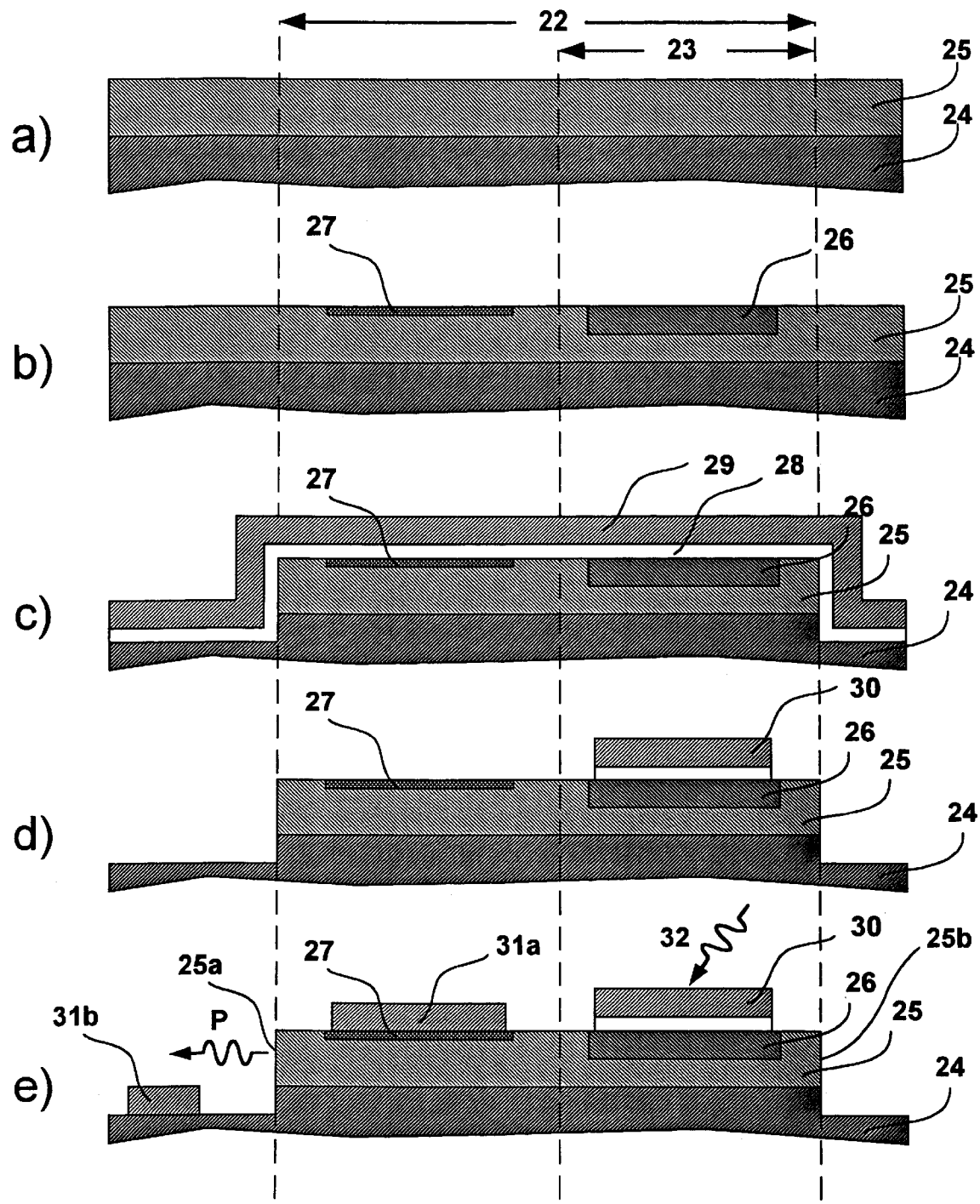
FIGS. 5 (A–E) shows the fabrication sequence of a semiconductor laser comprising an optically excited phonon generator of a first type.

A first embodiment of a device according to the present invention is shown in FIG. 5 and comprises a semiconductor laser that includes a Si laser cavity 22 and a phonon generator 23 that uses optical stimulation as described with reference to FIG. 3, to stimulate photo-emission in the laser cavity 22.

The device is fabricated as follows. Using p-type silicon as a substrate 24, a layer of intrinsic Si 25 is grown by low-pressure chemical vapour deposition in a manner well known per se as shown in FIG. 5a. The intrinsic Si layer 25 is 400 nm thick and has a background doping concentration of $N_i \leq 10^{15} cm^{-3}$. The surface of the intrinsic Si layer 25 is patterned using conventional optical lithography techniques to open a window 5×5 μm in optical resist. A succession of ion beam implantations using As+ and B+ ions are used to produce a highly doped ($N_B=N_{As}=10^{20} cm^{-3}$), fully compensated region 26 in the window region, as shown in FIG. 5b. The resist is removed and the surface of the intrinsic Si layer 25 is again patterned using conventional optical lithography techniques to open a window 20×20 μm in optical resist. A low-energy ion beam implantation using As+ ions is used to produce a shallow n-type well 27. The substrate is annealed at 1000° C. to remove lattice damage to and activate the implants.

A mesa is defined by depositing and patterning optical resist on the surface of the intrinsic 25 and compensated 26 layers and by using a $CF_4/O_2$ reactive ion etch. A $SiO_2$ tunnel barrier 28 is grown by dry oxidation at 900° C. across the whole surface. The thickness of the $SiO_2$ barrier 28 is about 5 nm. An Al layer 29 is then sputtered in a manner well known per se to produce the configuration shown in FIG. 5c. The thickness of the Al layer 29 is 50 nm. A window in optical resist is opened over the intrinsic region 25 and the Al layer 29 and the $SiO_2$ tunnel barrier 28 are dry etched using $BCl_3/Cl_2$ and $CHF_3$ respectively to leave a surface gate 30 over the compensated region 26 as shown in FIG. 5d.

Finally, 200 nm of Al:Si (99:1) alloy is deposited on the surface of the mesa and the substrate and patterned using conventional optical lithographic techniques and $BCl_3/Cl_2$ RIE to form laser ohmic contacts 31a, 31b shown in FIG. 5e. It will be understood that the semiconductor laser has a cavity which extends between opposite ends of the mesa thus formed such that the side edges 25a, b of the mesa define semi-reflective ends facets for the cavity. Cavity 22 is primarily filled with intrinsic silicon which does not normally exhibit a lasing action because it is an indirect bandgap material. However, the phonon generator 23 produces phonons which allow photons to be produced in the laser cavity when a suitable bias voltage is applied to the laser ohmic contract 31a, 31b. This will now be described in more detail.

Operation of the semiconductor laser will now be described.

The laser is primed by applying a bias of V=1.5V between the ohmic contacts 31a, 31b of the laser, to produce a ready supply of electron and holes within the intrinsic Si layer 25 that are ready to recombine. However, in the absence of phonons, the electrons and holes do not recombine radiatively and so the laser does not emit light.

The phonon generator is primed by applying a gate voltage $V_g$=5V to the surface gate 30, with the compensated Si layer 26 grounded, to create an electric field at the surface of the compensated Si layer 26.

To trigger phonon generation, a frequency-doubled Ti-Saphire laser is used to generate a train of light pulses 32 that is directed onto the surface of the phonon generator 23. Each pulse has a duration of 50 fs and a wavelength of 400–600 nm and the train length has a duration, T, where T≧50 fs. Electron-hole pairs are generated in the compensated Si layer 26 and are separated by the applied field, which creates an electric dipole. The dipole interacts with local lattice polarisations to produce optic phonons. These optic phonons decay into high energy, high wavevector phonons. This process generates a pulsed supply of phonons that bathes the laser cavity. This increases the efficiency of photon emission and enables the intrisic Si 25 to emit photons.

A lasing action occurs within the cavity 22 between the end facets 25a, b, with the result that light is emitted from the cavity as shown by arrow P in FIG. 5e. The duration of the pulse of emitted light is approximately T. The wavelength of the emitted light P is 1.1 μm.

Figure 6:
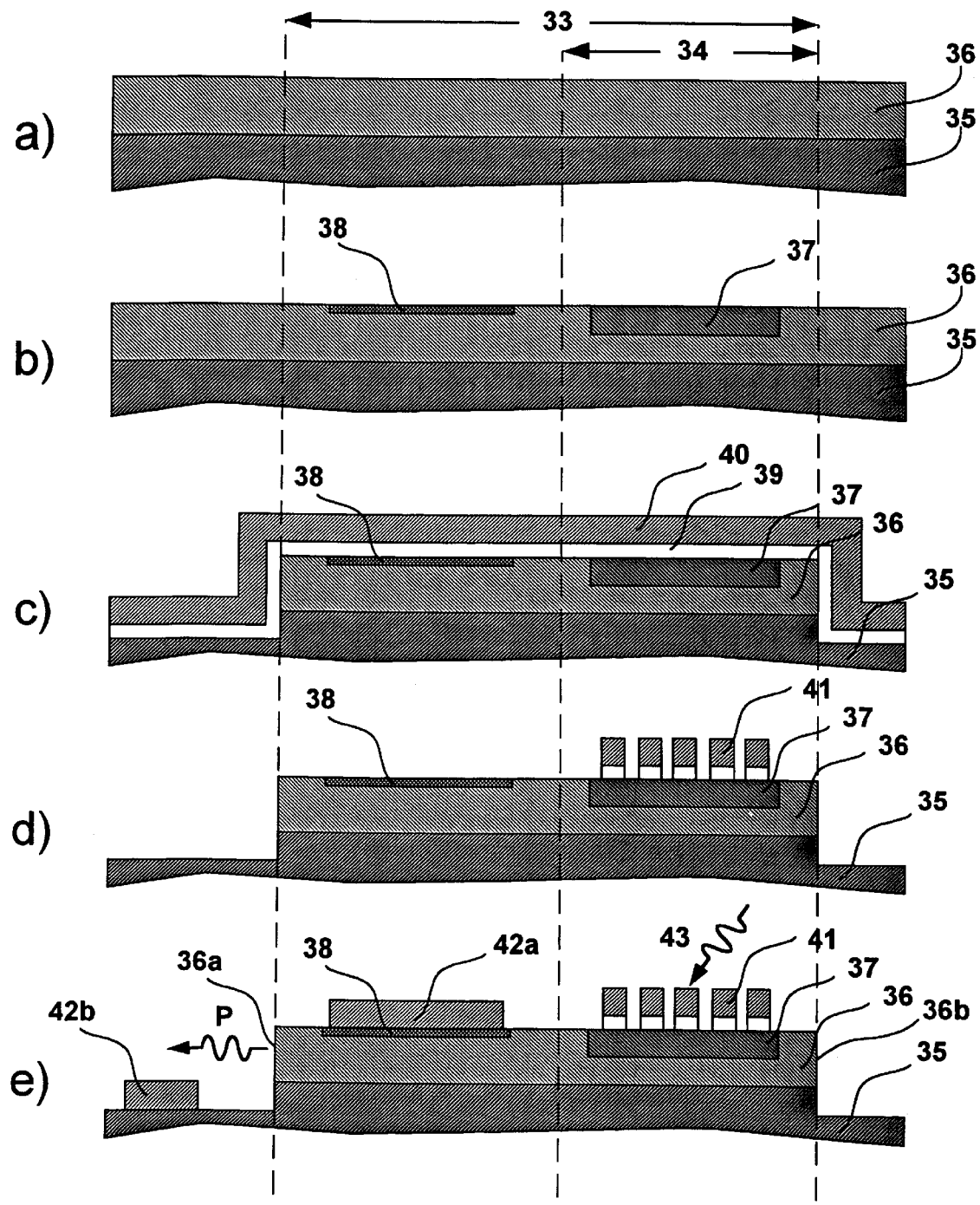
FIGS. 6 (A–E) shows the fabrication sequence of a semiconductor laser comprising an optically excited phonon generator of another configuration of a second type.

Referring to FIG. 6, a second embodiment of the present invention is a semiconductor laser comprising a laser cavity 33 and a phonon generator 34 based on optical stimulation according to the principles previously described with reference to FIG. 4.

Using p-type silicon as a substrate 35, a layer of intrinsic Si 36 is grown by low-pressure chemical vapour deposition in a manner well known per se as shown in FIG. 6a. The intrinsic Si layer 36 is 400 mn thick and has a background doping concentration of $N_i \leq 10^{15} cm^{-3}$. The surface of the intrinsic Si layer 36 is patterned using conventional optical lithography techniques to open a window 5×5 μm in optical resist. A succession of ion beam implantations using As+ and B+ ions are used produce a highly doped ($N_B=N_{As}=10^{20} cm^{-3}$), fully compensated region 37 in the window region, as shown in FIG. 6b. The resist is removed and the surface of the intrinsic Si layer 36 is again patterned using conventional optical lithography techniques to open a window 20×20 μm in optical resist. A low-energy ion beam implantation using As+ ions is used to produce a shallow n-type well 38. The substrate is annealed at 1000° C. to remove lattice damage to and activate the implant.

A mesa is defined by depositing and patterning optical resist on the surface of the intrinsic 36 and compensated 37 layers and by using a $CF_4/O_2$ reactive ion etch. A $SiO_2$ tunnel barrier 39 is grown by dry oxidation at 900° C. across the whole surface. The thickness of the $SiO_2$ barrier 39 is about 5 nm. An Al layer 40 is then sputtered in a manner well known per se to produce the configuration shown in FIG. 6c. The thickness of the Al layer 40 is 50 nm. A window in optical resist is opened over the intrinsic region 35 and the Al layer 40 and the $SiO_2$ tunnel barrier 39 are dry etched using $BCl_3/Cl_2$ and $CHF_3$ respectively to leave a patterned surface gate 41 over the compensated region 36 as shown in FIG. 6d.

Finally, 200 nm of Al:Si (99:1) alloy is deposited on the surface of the mesa and the substrate and patterned using conventional optical lithographic techniques and $BCl_3/Cl_2$ RIE to form laser ohmic contacts 42a, 42b shown in FIG. 6e.

Operation of the semiconductor laser will now be described.

The laser is primed by applying a bias of V=1.5V between the ohmic contacts 42a, 42b of the laser, to produce a ready supply of electron and holes within the intrinsic Si layer 36 that are ready to recombine However, in the absence of phonons, the electrons and holes do not recombine and so the laser does not emit light.

The phonon generator is primed by applying a gate voltage $V_g$=5V to the patterned surface gate 41, with the compensated Si layer 37 grounded, to create an electric field at the surface of the compensated Si layer 37.

To trigger phonon generation, a frequency-doubled Ti-Saphire laser is used to generate a train of light pulses 43 that is directed onto the surface of the phonon generator 41. Each pulse has a duration of 50 fs and a wavelength of 400–600 nm and the train length has a duration, T, where T≧50 fs. Electron-hole pairs are generated in the compensated Si layer 37 and are separated by the applied field, which creates an electric dipole. The dipole interacts with local lattice polarisations to produce optic phonons. These optic phonons decay into high energy, high wavevector phonons. This process generates a pulsed supply of phonons that bathes the laser cavity. This increases the efficiency of photon emission and enables the intrinsic Si 36 to emit photons.

A lasing action occurs within the cavity 33 between the end facets 36a, b, with the result that light is emitted from the cavity as shown by arrow P in FIG. 6e. The duration of the pulse of emitted light is approximately T. The wavelength of the emitted light P is 1.1 µm.

It will be appreciated that the optically excited phonon generators described in the first and second embodiments of the present invention may be replaced by an electrically stimulated phonon generator as previously described with reference to FIG. 3.

Figure 7A:
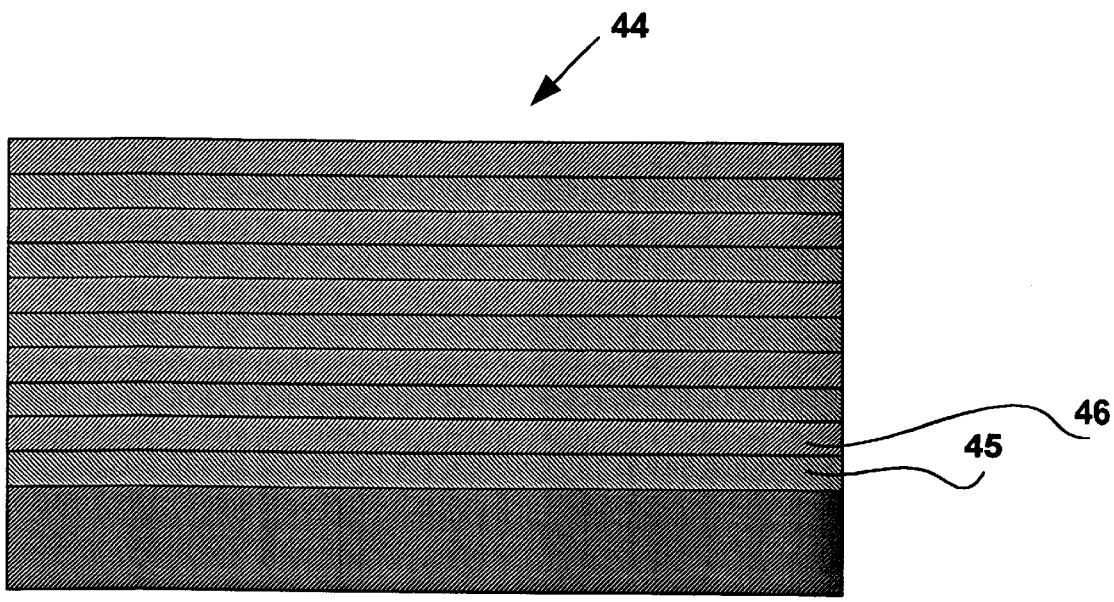
FIGS. 7a and b shown doping structures suitable for creating local lattice polarisations.
Figure 7B:
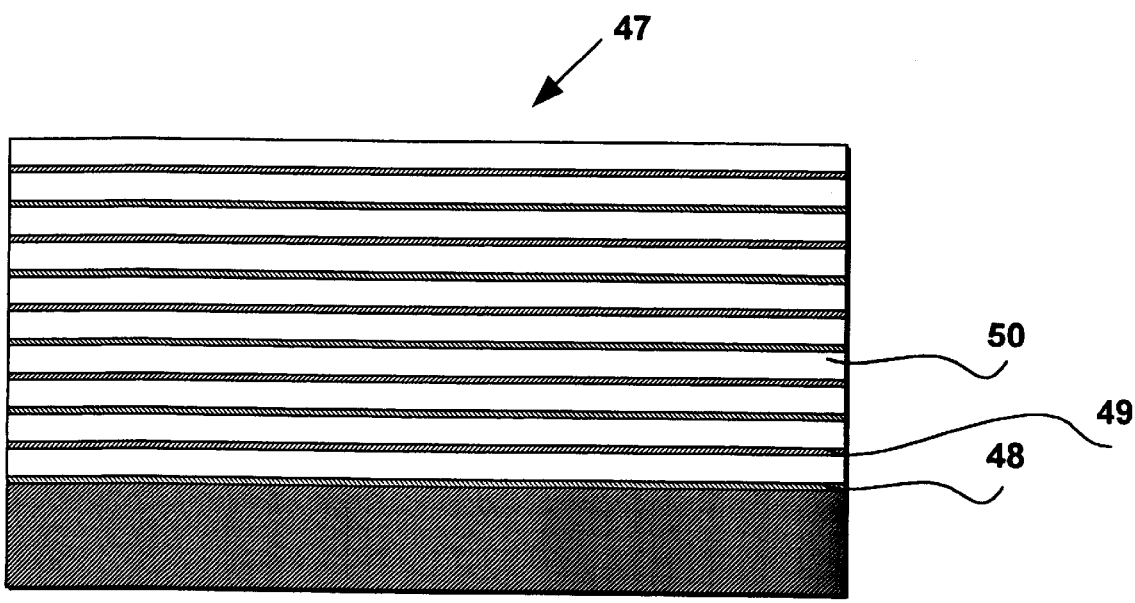

The embodiments above use heavily doped, fully compensated Si to produce local lattice polarisation. Referring to FIGS. 7a and 7b, alternative doping structures may be used for the regions 26, 37 in FIGS. 5 and 6 respectively.

A first alternative doping structure 44 comprises growing alternate layers of n-type 45 and p-type 46 Si, doped with As and B respectively, although other n- and p-type impurities may be used. The alternate layers are 2nm thick and the doping concentration are $N_{As}=N_B=1\times10^{20}\text{cm}^{-3}$.

A second alternative doping structure 47 comprises growing Si in which are inserting alternate n-type 48 and p-type 49 δ-doped doped layers in Si 50, comprising As and P respectively, although other n- and p-type impurities may be used. The δ-doped layers are spaced 2 nm apart and the sheet doping concentration are $N_{2D:As}=N_{2D:B}=2\times10^{13}\text{cm}^{-2}$.

Phonon Generation by Hot-Electron Relaxation

Figure 8:
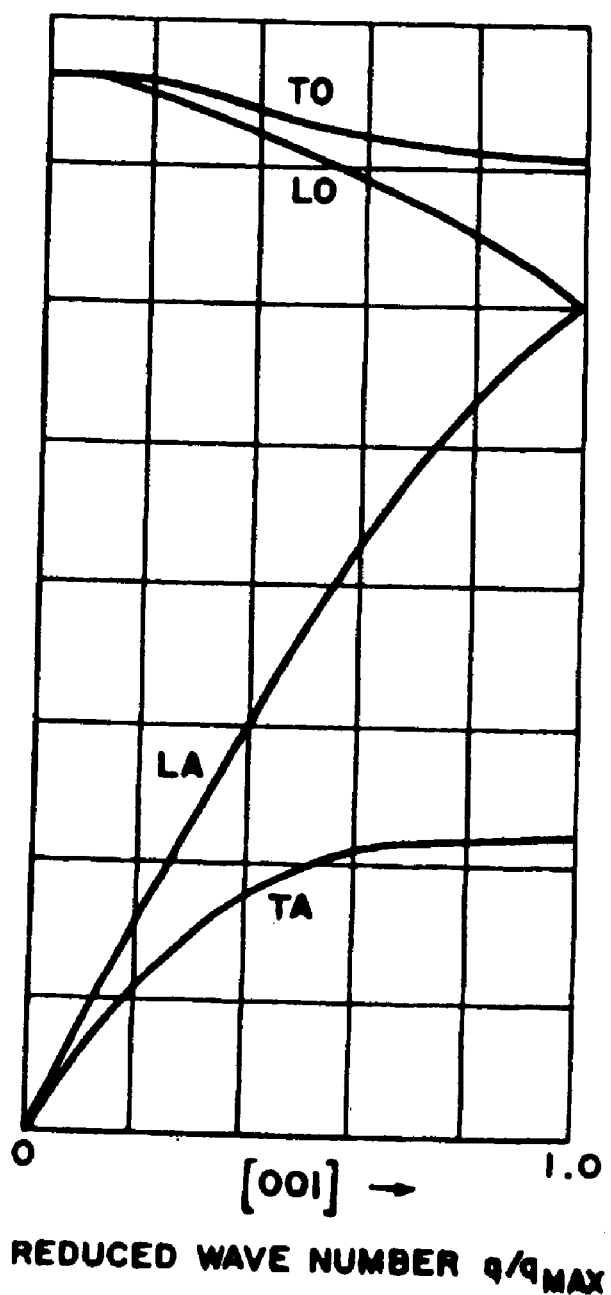
FIG. 8 is a phonon dispersion relation for silicon.

FIG. 8 illustrates a phonon dispersion relationship for silicon for Transverse Acoustic (TA), Longitudinal Acoustic (LA), Transverse Optic (TO) and Longitudinal Optic (LO) phonons. Phonon wavenumber as a proportion of the Brillouin zone is plotted along the abscissa and phonon energy is plotted along the ordinate. The TA phonon dispersion relation is relatively flat at high values of wavevector. In other words, there is little change in energy over a large wavevector range. If electrons are injected into the active region of a phonon generator with a kinetic energy similar to or slightly higher than the flat region of the TA phonon curve, corresponding to about 20 meV above the conduction band edge, the electrons will loose energy by TA phonon scattering. Phonon-phonon scattering will then generate the phonons of the correct wavevector for optical excitation and the excitation will itself increase the coupling of that wavevector.

Figure 9:
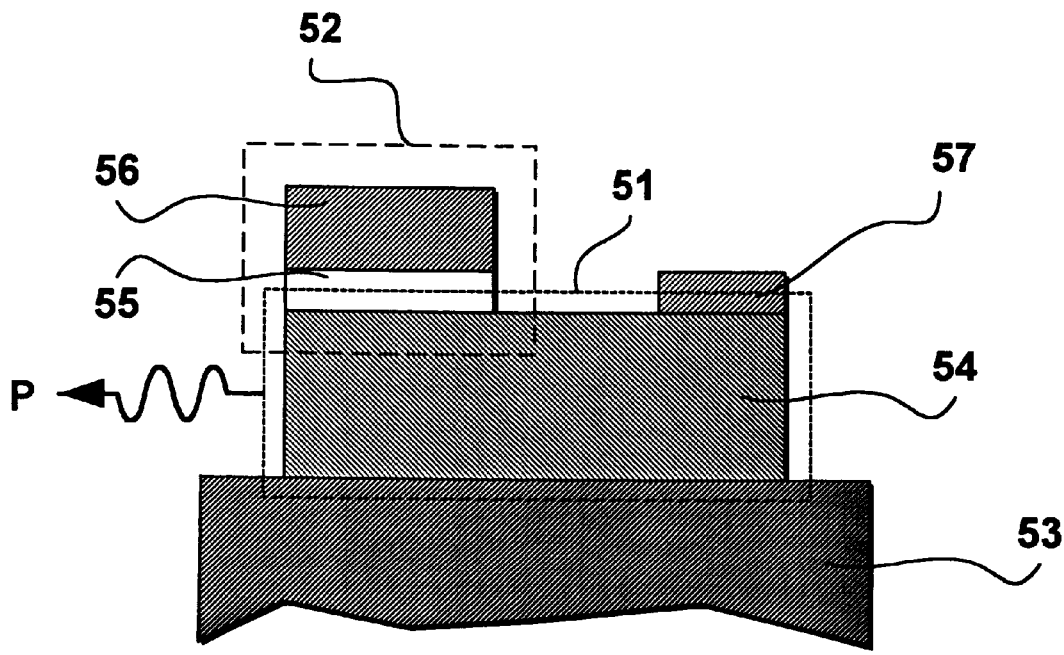
FIG. 9 is a cross-sectional view of a semiconductor laser incorporating a phonon generator.

Referring to FIG. 9, a third embodiment of the present invention is a semiconductor laser comprising a cavity 51 and a phonon generator 52 based on hot electron relaxation.

Using <100> orientated p-type silicon as a substrate 53, an intrinsic layer Si 54 is epitaxially grown by low-pressure chemical vapour deposition in a manner well known per se. The intrinsic Si layer 54 is 400 nm thick and has a background doping concentration of $N_I \leq 10^{15}\text{cm}^{-3}$. A SiO₂ tunnel barrier 55 is grown by dry oxidation at 800° C. The thickness of the SiO₂ barrier 55 is about 3 nm. An Al contact 56 is then sputtered in a manner well known per se. The thickness of the Al layer 56 is 200 nm.

The surface is patterned using conventional optical lithographic techniques and a portion of the Al contact 56 and the underlying SiO₂ barrier 55 are removed by dry etching. The portion that is not removed forms the hot-electron injector of the phonon generator 52.

A shallow B⁺ion implant is used to define a p-type ohmic contact region. A layer of Al:Si (99:1%) is sputtered and patterned using conventional lithographic and etching techniques to form the p-type contact 57 to the intrinsic Si layer 54. Using a CF₄/O₂ dry etch a laser cavity is defined with optically flat and parallel facing ends.

Operation of the semiconductor laser will now be described.

A negative bias is applied to the Al layer 56 with respect to the contact 57 and typically, V=2V. Electrons are injected from the Al contact 56 into the intrinsic Si layer 54. Hot electrons tunnel through the SiO₂ barrier 55 and are thermalised by generating phonons. The thermalised electrons combine with holes injected by the contact 57, emitting light. The light is thus emitted into cavity 51 so as to stimulate a laser action, with the result that light is in the direction of arrow P cavity as shown by arrow P.

Figure 10:
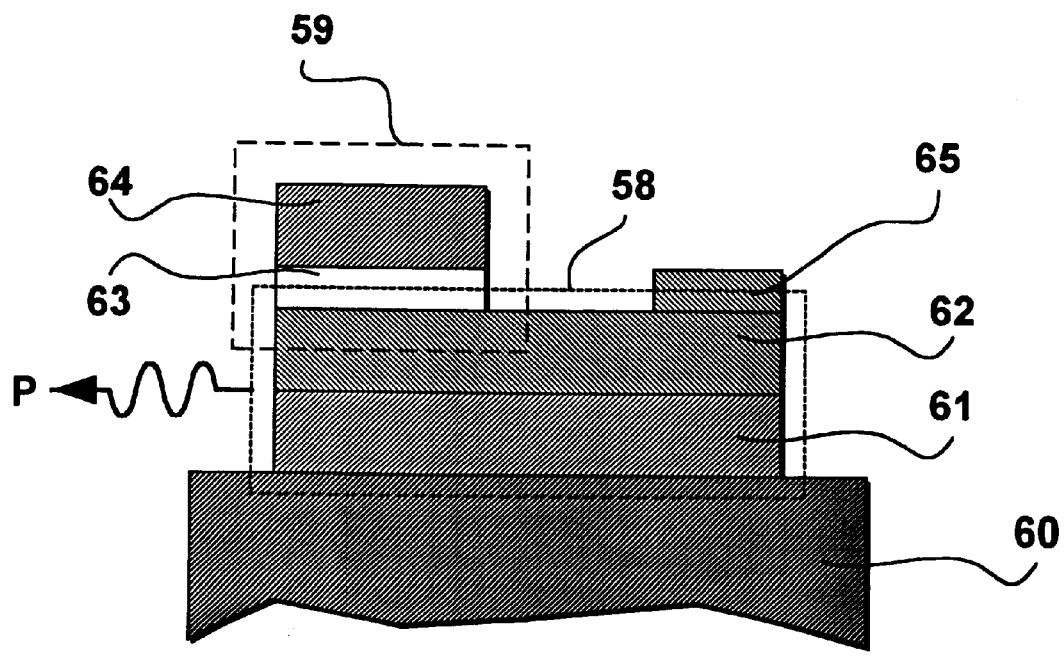
FIG. 10 is a cross-sectional view of a semiconductor homojunction laser incorporating a phonon generator.

Referring to FIG. 10, a fourth embodiment of the present invention is a homojunction semiconductor laser comprising a cavity 58 and a phonon generator 59 based on hot electron relaxation.

Using <100> orientated p-type silicon as a substrate 60, a layer of p-type Si 61 is epitaxially grown by low-pressure chemical vapour deposition in a manner well known per se. The p-type Si layer 61 is 200 nm thick and is doped with B to a concentration of $N_B=10^{18}\text{cm}^{-3}$. A layer of n-type Si 62 is epitaxially grown. The n-type Si layer 62 is 200 nm thick and is doped with As to a concentration of $N_{As}=10^{18}\text{cm}^{-3}$. A SiO₂ tunnel barrier 63 is grown by dry oxidation at 800° C. The thickness of the SiO₂ barrier 63 is about 3 nm. Finally, an Al contact 64 is sputtered in a manner well known per se. The thickness of the Al layer 56 is 200 nm.

The surface is patterned using conventional optical lithographic techniques and a portion of the Al contact 64 and the underlying SiO₂ barrier 63 are removed by dry etching. The portion that is not removed forms the hot-electron injector of the phonon generator 59.

A layer of Al:Si (99:1%) is sputtered and patterned using conventional lithographic and etching techniques to form an ohmic contact 65 to the n-type Si layer 62. An ohmic contact (not shown) is made to the reverse side of the p-type substrate 60 in a manner well known per se. Using a CF₄/O₂ dry etch a laser cavity 58 is defined with optically flat and parallel facing ends.

Operation of the semiconductor laser will now be described.

The laser is primed by forward biasing the p-n junction with a bias voltage, $V_b$, of 2V between the ohmic contact 65 to the n-type Si layer 62 and the ohmic contact (not shown) to the p-type substrate 60.

To generate phonons, electrons are injected from the Al contact 64 into the n-type Si layer 62 by applying to the Al contact 64 an injection bias, $V_{inj}$, of −0.5V. Hot electrons tunnel through the SiO₂ barrier 63 and are thermalised by generating phonons. These phonons promote electron-hole recombination at the p-n junction with the result that photons of energy 1.12 eV are emitted into cavity 58, stimulating laser action such that laser light leaves the cavity in the direction of arrow P.

Figure 11:
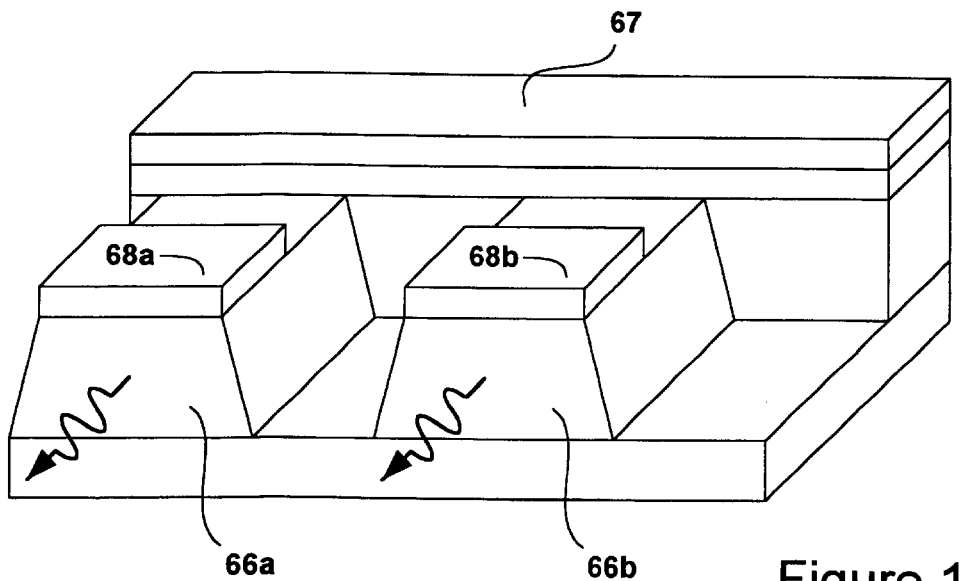
FIG. 11 is a perspective view of an array of semiconductor lasers.

FIG. 11 illustrates a fifth embodiment of the present invention that comprises an array of semiconductor lasers.

The array of lasers comprises first and second lasers 66a, 66b as shown in FIGS. 9 or 10 above. The first and second lasers 66a, 66b share the same aluminium metallization 67 from which hot electrons are injected. However, the first and second lasers 66a, 66b have separate electrical contacts 68a, 68b corresponding to contacts 57 or 65 in FIGS. 9 or 10 for switching on and off each laser independently of each other. Such an arrangement can be used to convert an electrical data bus into an optical databus, with the optical signals being fed into optical waveguides.

Figure 12:
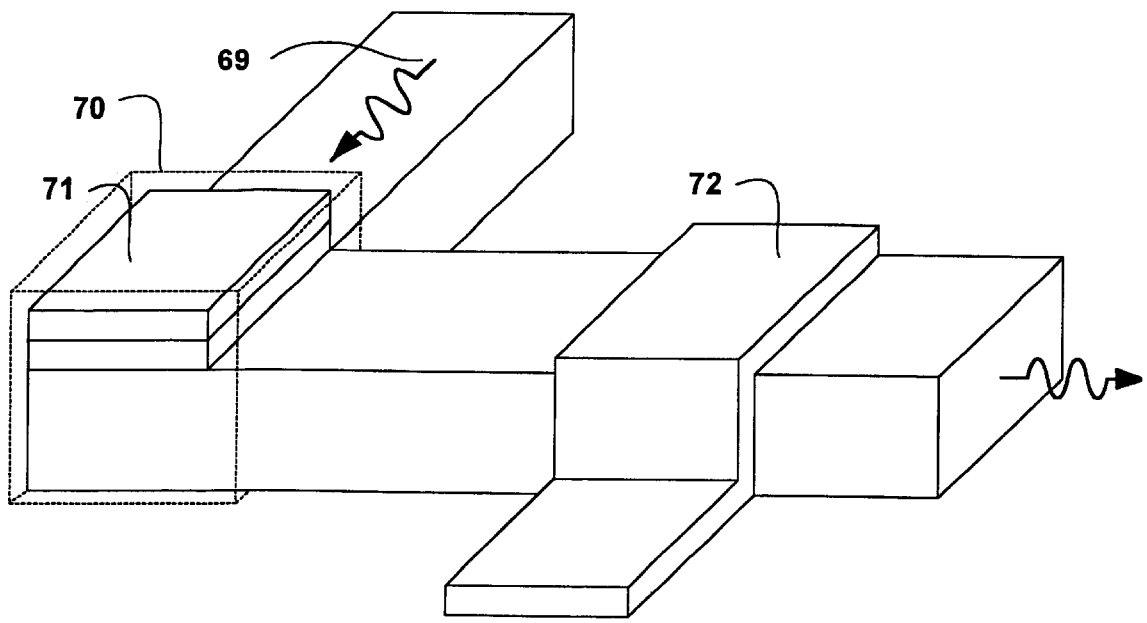
FIG. 12 is a perspective view of a modulator.

FIG. 12 illustrates a sixth embodiment of the present invention that comprises an optical modulator.

Incoming light pulses pass down an optical waveguide 69 comprising silicon. The light pulses serve as the optical stimulation for the generation of phonons in a phonon generator 70 as shown in FIG. 9 above. An electrical pulse of V=2V is applied between the gate 71 of phonon generator 70 and the contact 72.

Different arrangements may be used for the phonon generator and for the cavity of the semiconductor laser.

Figure 13:
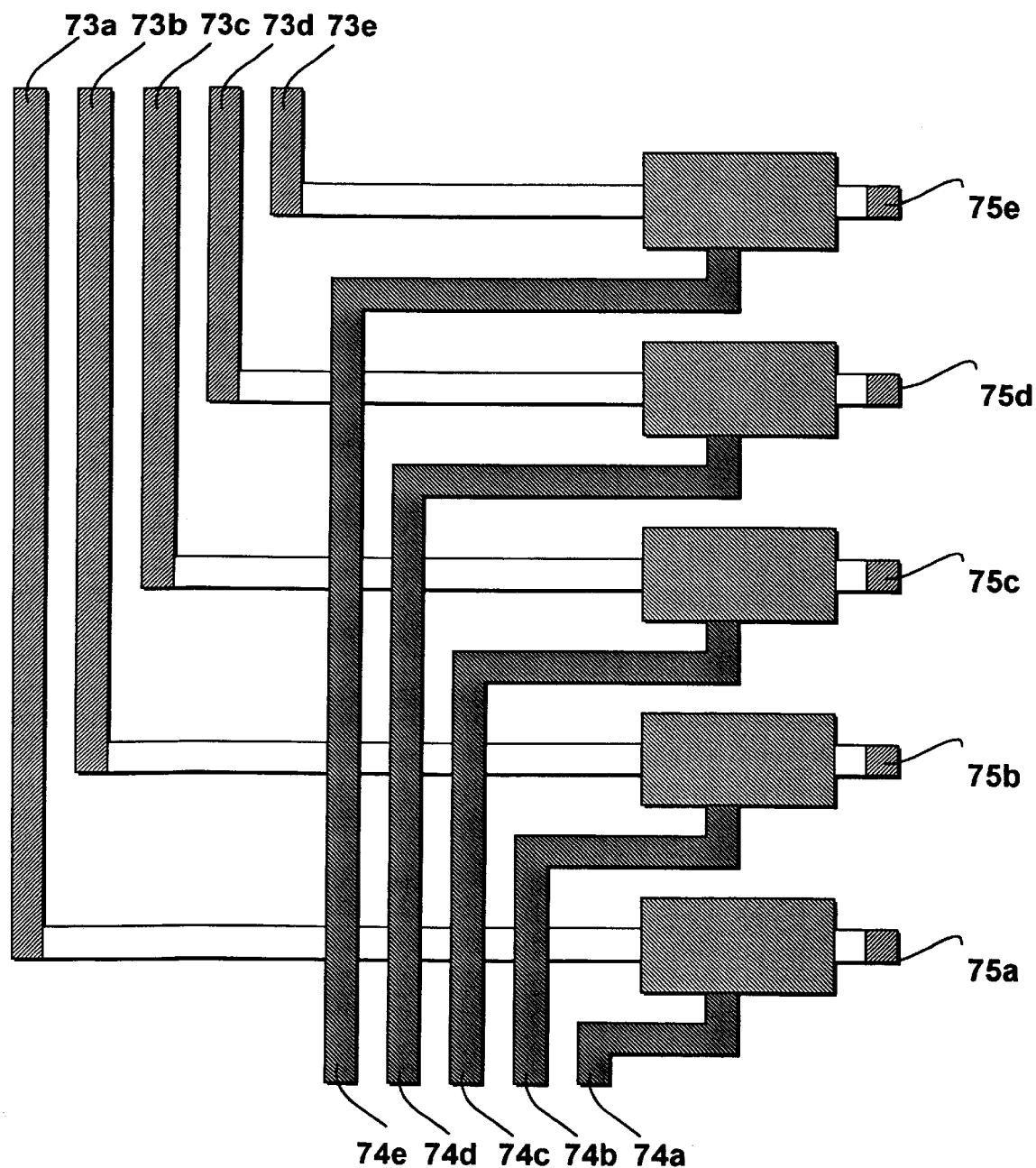
FIG. 13 is a schematic of an array of modulators.

Referring to FIG. 13, the arrangement as shown in FIG. 12 may be incorporated into switching circuits. Optical inputs, carried by micro-fabricated waveguides 73a, 73b, 73c, 73d, are switched by electric inputs, conveyed by metal tracks 74a, 74b, 74c, 74d. Outputs are delivered to waveguides or optical fibres through optical couplings 75a, 75b, 75c, 75d. In this example, the outputs are sequentially delayed by having different phonon path lengths between the phonon generation region and the electrical injection region.

It will be appreciated that many modifications may be made to the embodiments above. For instance, any indirect band gap semiconductor may benefit from phonon injection including, but not limited to, Germanium (Ge), Aluminium Antimonide (AlSb), Gallium Phosphide (GaP), Silicon Carbide (SiC) and ternary alloys containing these binary compositions. The device need not necessarily have a laser cavity. The device may be a light emitting diode.

A phonon generator may also be used to change the absorption coefficient in Si. Silicon is transparent in the infrared. Supplying phonons will effectively reduce the band-gap energy and so promote photon absorption. This may be used to fabricate a modulator.

As used herein, "optical processes" is intended to include processes involving visible and non-visible radiation, and includes infrared and ultraviolet radiation.

What is claimed is:

1. A photon emission device comprising:
    a region of relatively low-efficiency photon emission material and
    a phonon generator operable to supply phonons to said region of relatively low-efficiency photon emission material so as to make said region to emit photons with a relatively high-efficiency.

2. A device according to claim 1, wherein said phonon generator comprises an input structure to receive electromagnetic energy so as to produce phonons.

3. A device according to claim 1, wherein said phonon generator comprises a converter to convert electrical excitations into lattice excitations.

4. A device according claim 1, wherein said phonon generator comprises an electrode to apply an electric field so as to produce phonons.

5. A device according to claim 1, wherein said phonon generator comprises a fabricated device arranged on a substrate.

6. A device according to claim 1, wherein said region of relatively low-efficiency photon emission material comprises indirect band gap semiconductor material.

7. A device according to claim 6 wherein said indirect band gap semiconductor material comprises silicon.

8. A device according to claim 1, wherein said phonon generator comprises a local lattice polarizer.

9. A device according to claim 8, wherein said local lattice polarizer comprises doped, compensated semiconductor.

10. A device according to claim 8, wherein said local lattice polarizer comprises a first layer of semiconductor doped with n-type impurities and a second layer of semiconductor doped with p-type semiconductor.

11. A device according to claim 10, wherein said first layer and said second layer are separated by 1–5 nm.

12. A device according to claim 8, wherein said phonon generator further comprises an electric field generator.

13. A device according to claim 12, wherein said electric field generator comprises an electrode disposed at an interface with said local lattice polarizer.

14. A device according to claim 12, said electric field generator comprises an electrode and an insulator, wherein said insulator is disposed between said local lattice polarizer and said electrode.

15. A device according to claim 9, wherein said phonon generator further comprises an electron-hole pair generator.

16. A device according to claim 15, wherein said electron-hole pair generator comprises a pulse of electromagnetic radiation.

17. A device according to claim 16, wherein said pulse has duration less than 100 fs.

18. A device according to claim 16, wherein said pulse of electromagnetic radiation has an energy in excess of the value of the band gap energy of said doped, compensated semiconductor.

19. A device according to claim 15, wherein said electron-hole pair generator comprises an electric pulse.

20. A device according to claim 19, wherein said pulse has duration less than 50 ps.

21. A device according to claim 19, wherein said pulse height is of the order of volts.

22. A device according to claim 1, wherein said phonon generator comprises a hot-electron injector.

23. A device according to claim 22, wherein said hot-electron injector comprises an electrode and a layer of insulator.

24. A device according to claim 23, further comprising a hot-electron thermalizer so as to create phonons.

25. A device according to claim 23, wherein said electrode comprises a metal.

26. A device according to claim 25, wherein said metal comprises aluminium.

27. A device according to claim 23, wherein said insulator comprises silicon dioxide.

28. A device according to claim 23, wherein said insulator comprises silicon nitride.

29. A device according to claim, 23 wherein said layer of insulator has a thickness less than 20 nm.

30. A method of operating a phonon emission device comprising a region of relatively low-efficiency photon emission material, said method comprising supplying phonons to said region of relatively low-efficiency photon emission material so as to make said region to emit phonons with a relatively high-efficiency.

* * * * *

UNITED STATES PATENT AND TRADEMARK OFFICE
CERTIFICATE OF CORRECTION

PATENT NO. : 6,483,100 B1  
DATED : November 19, 2002  
INVENTOR(S) : David Arfon Williams et al.

It is certified that error appears in the above-identified patent and that said Letters Patent is hereby corrected as shown below:

<u>Title page, Item [54] and Column 1, line 1,</u>  
Change the title to read: -- PHOTONIC DEVICE HAVING A REGION OF PHOTON EMISSION MATERIAL --.

<u>Column 2,</u>  
Line 52, change "FIGS. 5 (A-E) shows" to -- FIGS. 5 (A-E) show --.  
Line 55, change "FIGS. 6 (A-E) shows" to -- FIGS. 6 (A-E) show --.

<u>Column 7,</u>  
Line 25, change "δ8-doped" to -- δ-doped --.

Signed and Sealed this

Thirtieth Day of December, 2003

JAMES E. ROGAN  
*Director of the United States Patent and Trademark Office*

UNITED STATES PATENT AND TRADEMARK OFFICE
CERTIFICATE OF CORRECTION

PATENT NO. : 6,483,100 B1 Page 1 of 1
DATED : November 19, 2002
INVENTOR(S) : David Arfon Williams et al.

It is certified that error appears in the above-identified patent and that said Letters Patent is hereby corrected as shown below:

Column 7,
Line 25, change "$\delta 8$-doped" to -- $\delta$-doped --.

Signed and Sealed this

Twenty-third Day of March, 2004

JON W. DUDAS
*Acting Director of the United States Patent and Trademark Office*